(12) United States Patent
Oh et al.

(10) Patent No.: US 7,480,098 B2
(45) Date of Patent: Jan. 20, 2009

(54) MICROLENS ARRAY SHEET HAVING BLACK MATRIX AND METHOD OF MANUFACTURING THE SAME

(75) Inventors: Chang-Hoon Oh, Seoul (KR); Hyouk Kwon, Seoul (KR); Tae-Sun Lim, Suwon-si (KR); Young-Joo Yee, Seongnam (KR); Ki-Won Park, Anyang-si (KR); Dong-Mug Seong, Ansan-si (KR); Gun-Woo Lee, Daegu (KR)

(73) Assignees: LG Electronics Inc., Seoul (KR); LG Micron Ltd., Gyeongsangbuk-do (KR)

( * ) Notice: Subject to any disclaimer, the term of this patent is extended or adjusted under 35 U.S.C. 154(b) by 206 days.

(21) Appl. No.: 11/212,097

(22) Filed: Aug. 26, 2005

(65) Prior Publication Data

US 2006/0050397 A1 Mar. 9, 2006

(30) Foreign Application Priority Data

Aug. 28, 2004 (KR) ...................... 10-2004-0068245

(51) Int. Cl.
*G02B 27/10* (2006.01)
*B29D 11/00* (2006.01)

(52) U.S. Cl. ....................................... 359/619; 264/1.1

(58) Field of Classification Search ......... 359/618–621, 359/626, 443, 455–457, 460; 264/1.1, 1.32, 264/1.7, 2.7

See application file for complete search history.

(56) References Cited

U.S. PATENT DOCUMENTS

| 4,509,823 | A | * | 4/1985 | Moriguchi et al. | .......... 359/457 |
| 4,708,920 | A | * | 11/1987 | Orensteen et al. | ............. 430/11 |
| 5,598,281 | A | * | 1/1997 | Zimmerman et al. | ........... 349/5 |
| 5,860,224 | A |  | 1/1999 | Larson | |
| 5,870,224 | A | * | 2/1999 | Saitoh et al. | ................. 359/456 |
| 6,781,733 | B1 |  | 8/2004 | Hira | |
| 2001/0012078 | A1 | * | 8/2001 | Hira et al. | ...................... 349/95 |
| 2004/0017612 | A1 | * | 1/2004 | Fadel et al. | ................. 359/619 |
| 2005/0017279 | A1 | * | 1/2005 | Mochizuki | .................. 257/294 |
| 2006/0061869 | A1 | * | 3/2006 | Fadel et al. | ................. 359/619 |

FOREIGN PATENT DOCUMENTS

| JP | 11-344602 | 12/1999 |
| JP | 2000-131506 | 5/2000 |

\* cited by examiner

*Primary Examiner*—Ricky L Mack
*Assistant Examiner*—Dawayne A Pinkney
(74) *Attorney, Agent, or Firm*—McKenna Long & Aldridge LLP

(57) ABSTRACT

Disclosed herein are a microlens array sheet having a black matrix and a method for manufacturing the same. The manufacturing method includes a) the step of defining the regions of light apertures, through which condensed light passes, in a negative-type light-sensitive resin layer by radiating and condensing parallel light after sequentially laying a microlens array layer, a transparent support substrate or film layer and the negative-type light-sensitive resin layer one on top of another, and b) eliminating portions other than the regions of the light apertures formed in the light-sensitive resin layer, and forming a black matrix layer in regions where the portions have been eliminated.

8 Claims, 5 Drawing Sheets

MICROLENS ARRAY SHEET HAVING BLACK MATRIX AND METHOD OF MANUFACTURING THE SAME

This application claims the benefit of Korean Patent Application No. 2004-0068245, filed Aug. 28, 2004, which is hereby incorporated by reference for all purposes as if fully set forth herein.

BACKGROUND OF THE INVENTION

1. Field of the Invention

The present invention relates generally to an optical sheet that is applicable to the screen of a display system and, more particularly, to a microlens array sheet having a black matrix and a method of manufacturing the same, in which, in order to form the black matrix that is a light blocking layer that covers regions other than light apertures, a light aperture pattern is formed through an exposure process performed toward a microlens sheet and on a light-sensitive resin layer under the microlens sheet, and the regions other than the light apertures are filled with a black pigment having a considerably low light reflective index and a considerably low transmittance.

2. Description of the Related Art

A screen used in a projection-type display system includes a microlens array sheet for spatially distributing emitted light collimated through an optical system so that the light can have a desired viewing angle, a black matrix layer for improving contrast by absorbing external light and minimizing the reflection of external light, and a light diffusion layer for diffusing the emitted light and eliminating speckles. In particular, a black matrix that is currently used to improve contrast is manufactured using methods, such as a Cr/CrOx metallization method, a resin black matrix method, a black matrix transfer method, etc.

The black matrix formation method using Cr/CrOx, which is mainly employed in a Liquid Crystal Display (LCD), uses Cr having an optical density of more than 3.5, so that it has characteristics of excellent light blocking performance and chemical resistance. However, the black matrix formation method is disadvantageous in that the process thereof is complicated and a facility cost is high, thus increasing the manufacturing cost because Cr/CrOx layers having a thickness of 0.1~0.2 μm must be sequentially laid one on top of another and then be etched. Furthermore, since Cr has a high reflective index, an additional process for achieving a low reflective characteristic is necessary.

The resin black matrix method, using resin including a black pigment, is advantageous in that it is simple because it forms a black matrix using photolithography after applying the resin. However, it is disadvantageous in that it is difficult to perform photolithography because a large amount of black pigment is required to attain high optical density and because exposure light, such as ultraviolet light for photolithography, cannot generally penetrate a high-density material in the depth direction thereof. In order to achieve desired optical density, the amount of a black pigment must be increased and the amount of resin must be decreased, so that a patterned shape formed through a developing process becomes rough due to the relatively small proportion of the resin, thus causing degradation in the brightness and viewing angle of an optical sheet having the black matrix that is formed by the above-described method.

The black matrix formation method using a pattern transfer technique includes a method using a light-sensitive adhesion layer and a method using a photothermal conversion layer.

The method using a light-sensitive adhesion layer utilizes the characteristic of a material in which portions onto which light is radiated lose adhesiveness. This method is a method of transferring a black matrix after radiating light onto a microlens sheet having a light-sensitive adhesion layer. This method is disadvantageous in that the boundary surfaces of light apertures, which are formed by the transfer of the black matrix, are rough, so that some light passing through the light apertures is lost.

Meanwhile, the method using a photothermal conversion layer is a method of transferring a black matrix from a donor substrate having a substrate, a photothermal conversion layer and a transfer layer to an acceptor substrate on which the black matrix is to be formed. This method is disadvantageous in that the donor substrate is relatively complicated, so that the manufacturing cost thereof increases.

SUMMARY OF THE INVENTION

Accordingly, the present invention has been made keeping in mind the above problems occurring in the prior art, and an object of the present invention is to provide a black matrix and a method of forming the black matrix, which can improve the contrast of a microlens array sheet.

Another object of the present invention is to provide a black matrix and a method of forming the black matrix, which do not affect the brightness and viewing angle of a microlens array sheet.

In order to accomplish the above-described objects, a method of manufacturing a microlens array sheet having a black matrix layer in accordance with the present invention includes a) the step of forming the regions of light apertures, through which condensed light (for example, focused light or concentrated light) passes, in a negative-type light-sensitive resin layer by radiating and condensing parallel light after sequentially laying a microlens array layer, a transparent support substrate or film layer and the negative-type light-sensitive resin layer one on top of another; and b) eliminating portions other than the regions of the light apertures formed in the light-sensitive resin layer, and forming a black matrix layer in regions where the portions have been eliminated.

Preferably, the present invention further includes the step of eliminating the regions of the light apertures which are formed in the light-sensitive resin layer and through which condensed light passes.

Preferably, the present invention further includes a light diffusion layer on the bottom surface of the black matrix layer.

In the present invention, the regions of the light apertures that are formed in the light-sensitive resin layer and through which condensed light (for example, focused light or concentrated light) passes, are formed such that the area of each region through which the condensed light enters is smaller than the area of the region through which the condensed light is emitted.

Preferably, in the present invention, the light-sensitive resin layer has a light transmittance of more than 90%.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

With reference to the accompanying drawings, the present invention is described in detail below. In the following description, specific items, such as specific elements, will be described. Those are provided only to help easily understand the present invention and, accordingly, it is apparent to those skilled in the art that various modifications, additions and substitutions are possible without departing from the scope and spirit of the invention as disclosed in the accompanying claims.

Figure 1:
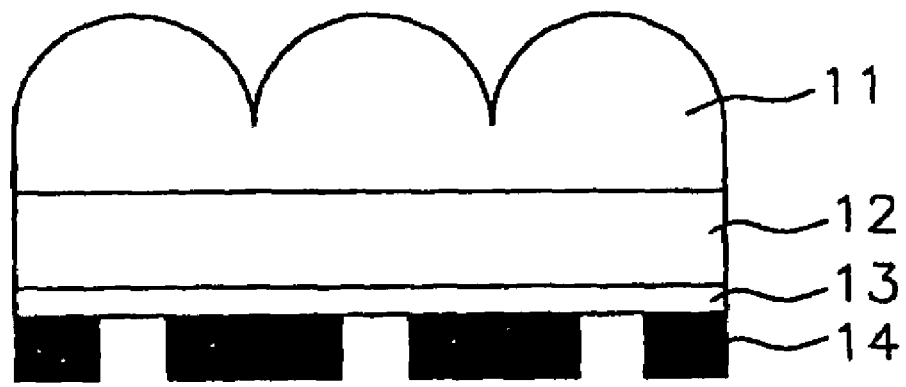
FIG. 1 is a sectional view of a conventional display screen.
Figure 2:
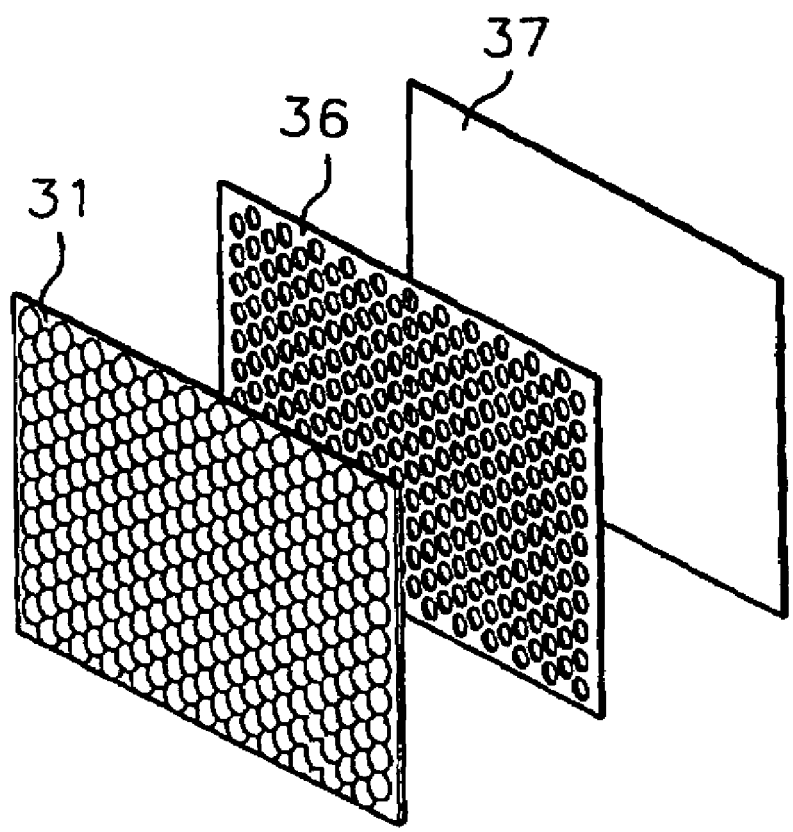
FIG. 2 is an exploded perspective view illustrating a microlens array sheet having a black matrix layer according to an embodiment of the present invention.

FIG. 2 is a perspective view illustrating a microlens array sheet having a black matrix layer according to an embodiment of the present invention.

In the above embodiment, the microlens array sheet includes a microlens array layer 31, a black matrix layer 36 and a light diffusion layer 37.

This embodiment employs a circular convex lens as a microlens, and schematically illustrates the sequential position of the black matrix layer in the laying of the elements.

Referring to FIG. 2, in the microlens array sheet, the microlens lens layer 31, the black matrix layer 32 having light apertures formed in alignment with individual microlenses, and the light diffusion layer 37 are sequentially laid one on top of another, thus forming a projection screen.

FIGS. 3A to 3D illustrate a process of forming a black matrix in a microlens array sheet according to an embodiment of the present invention.

In this embodiment, the microlens array sheet includes a microlens array layer 31, a transparent support substrate or film layer 32, and a black matrix layer 36.

The embodiment schematically illustrates a process of forming the black matrix layer 36 in which light apertures 35 are empty.

Figure 3A:
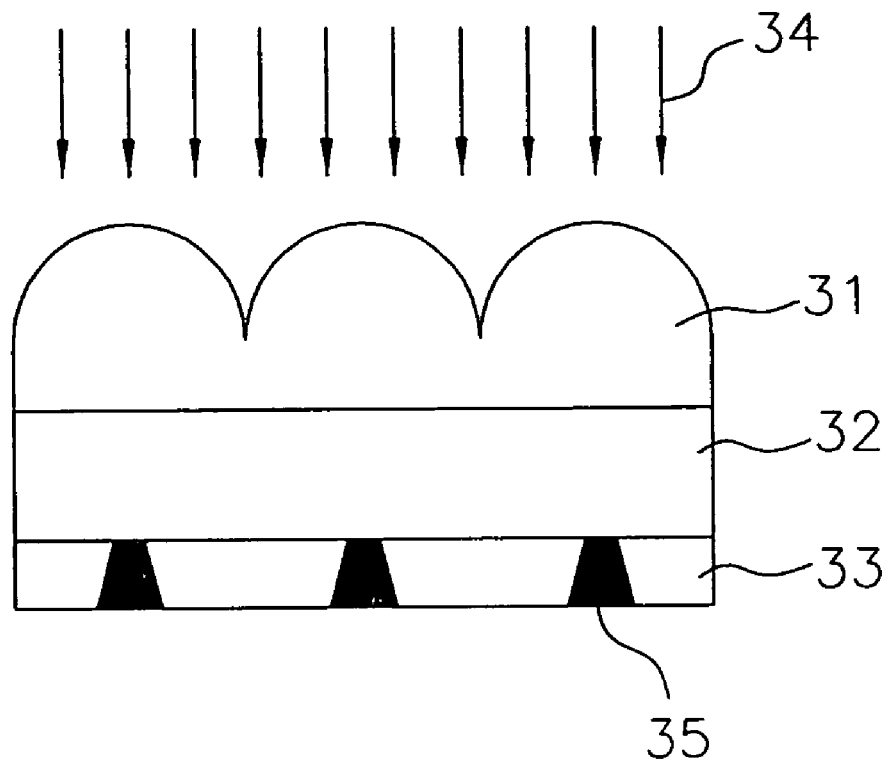
FIGS. 3A to 3D are views illustrating a process of forming a black matrix layer in accordance with an embodiment of the present invention.

FIG. 3A illustrates a process of forming the light apertures 35 in the light-sensitive resin layer 33. In this process, when parallel light 34 is radiated after the microlens array layer 31, the transparent support substrate or film layer 32 and the negative-type light-sensitive resin layer 33 are sequentially laid one on top of another, the parallel light 34 is condensed by the microlens array layer 31, and light aperture regions 35, rough which the condensed light passes, are defined in the negative light-sensitive resin layer 33 while being self-aligned.

Figure 3B:
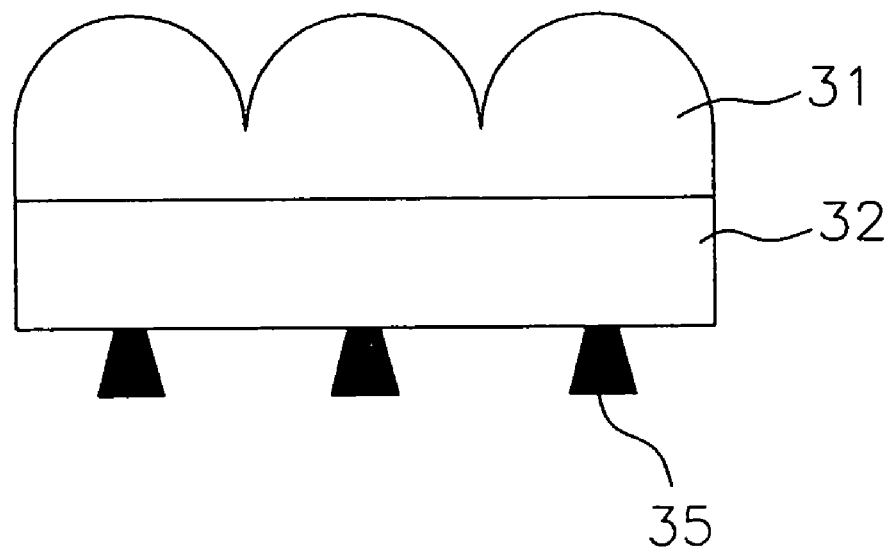

FIG. 3B illustrates a process of eliminating portions other than light apertures 35 that are formed in the light-sensitive resin layer 33. In this process, portions other than portions exposed to light are eliminated using a developing process.

Figure 3C:
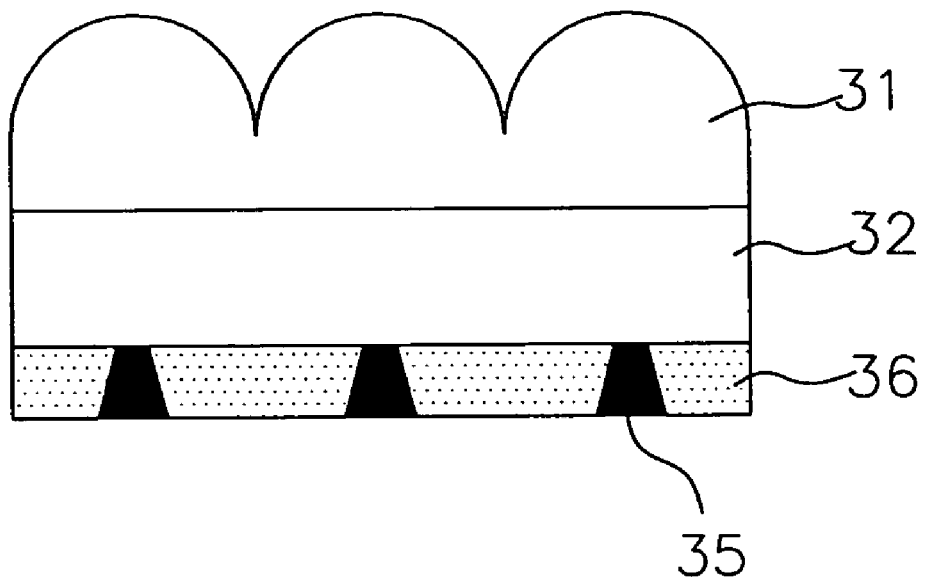
Figure 3D:
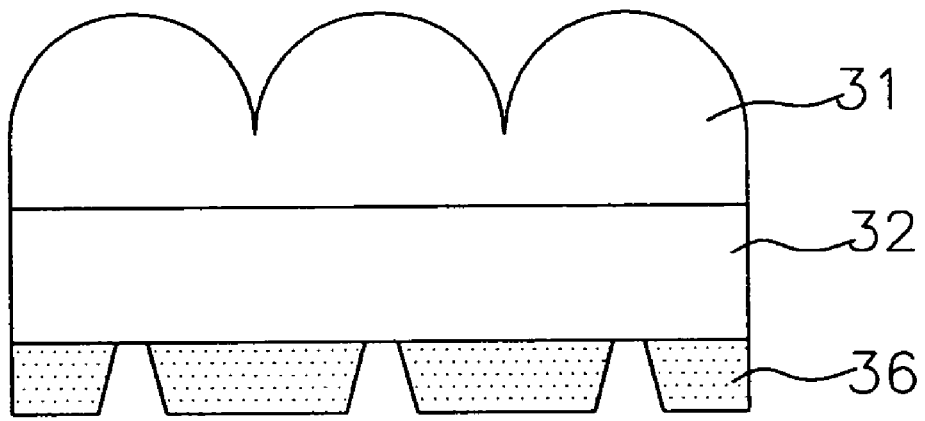

FIGS. 3C and 3D illustrate a process of forming the black matrix layer 36 and eliminating the light-sensitive resin layer 33 that forms the light aperture 35. In this process, portions other than portions exposed to light are eliminated using the developing process, and the area where the portions are eliminated is filled with black material having considerably low light transmissivity and considerably low reflectance. The black matrix layer 36 is formed by selectively eliminating the light apertures 35 and the self-aligned and patterned light-sensitive resin layer.

As described above, optical loss is minimized by defining the pattern of the light apertures 35 in a self-assignment fashion and forming the black matrix layer 36 in the regions other than the light apertures 35, and the improvement of brightness can be achieved by increasing the transmissivity of the microlens array sheet. Furthermore, the shape of the light apertures 35 is trapezoidal, so that there is an effect of preventing the loss of a viewing angle cased by the black matrix.

Figure 4A:
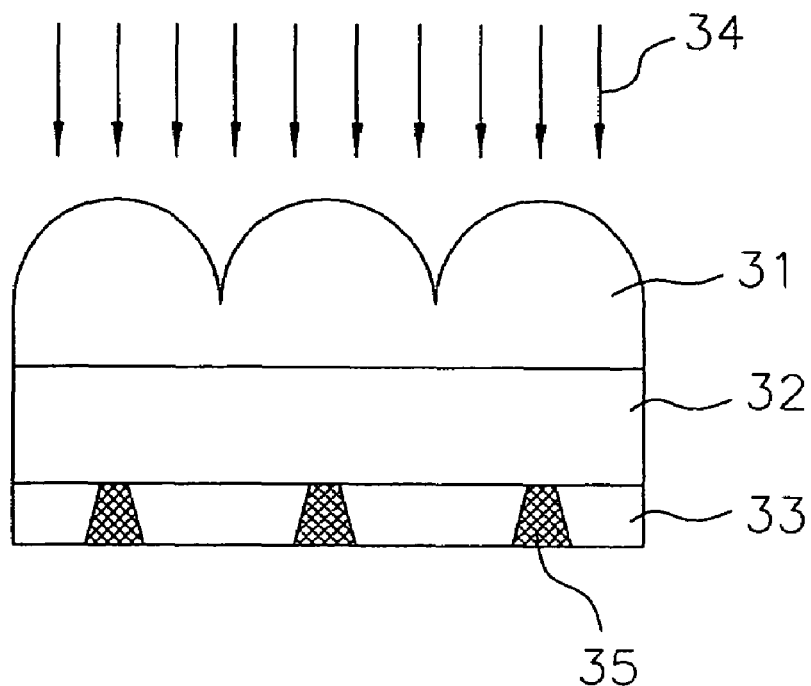
FIGS. 4A to 4C are views illustrating a process of forming a black matrix layer in accordance with another embodiment of the present invention.
Figure 4B:
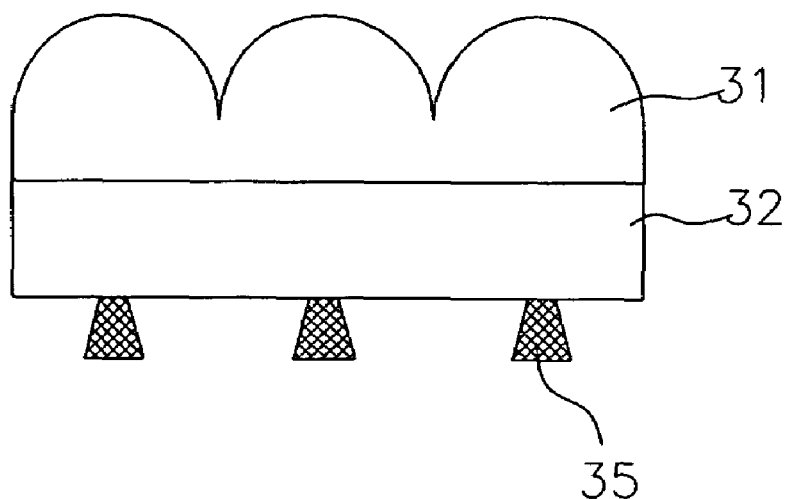
Figure 4C:
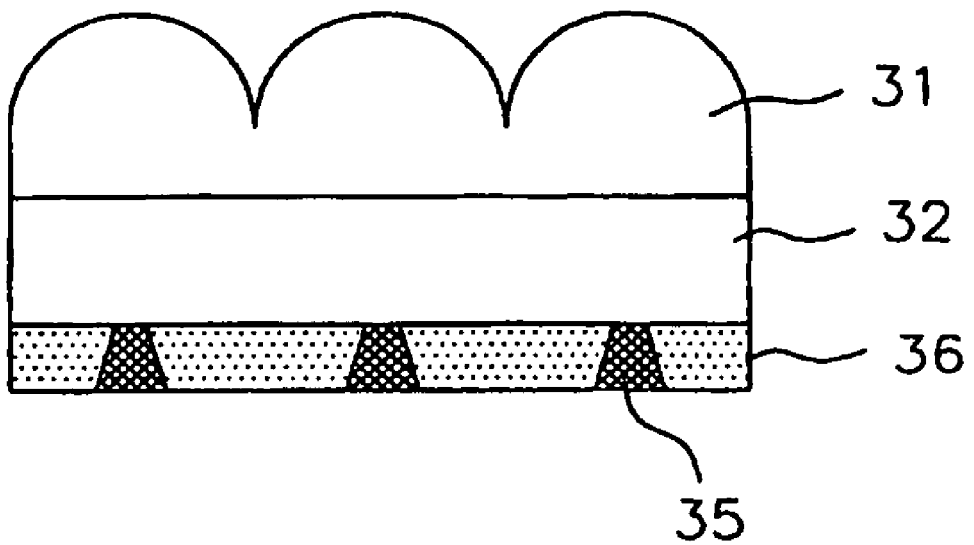

FIGS. 4A to 4C illustrate a process of forming another black matrix layer in a microlens array sheet according to an embodiment of the present invention.

In this embodiment, the microlens array sheet includes a microlens array layer 31, a transparent support substrate or film layer 32, a black matrix layer 36, and a light-sensitive resin layer 33 that is self-aligned with individual microlenses and exposed to light.

The embodiment schematically illustrates a process of forming the black matrix layer 36 in which the light apertures 35 are filled.

FIG. 4A illustrates a process of defining light apertures 35 in the light-sensitive resin layer 33. In this process, when parallel light 34 is radiated after the microlens array layer 31, the transparent support substrate or film layer 32 and the negative-type light-sensitive resin layer 33 have been sequentially laid one on top of another, the parallel light 34 is self-aligned by the microlens array layer 31 and defines the light apertures 35 in the negative-type light-sensitive resin layer 33 in condensed array form.

FIGS. 4B and 4C illustrate a process of eliminating portions other than the light apertures 35 defined in the light-sensitive resin layer 33 and forming the black matrix layer 36. In this process, portions other than portions exposed to light in a developing process are eliminated and the eliminated portions are filled with black material having considerably low light transmissivity and considerably low light reflectance, thus forming the black matrix layer 36. In order to improve the transmissivity of the microlens array sheet, it is preferred that the negative light-sensitive resin layer 33 have a light transmissivity of more than 90%. That is, in the process of forming the black matrix layer in accordance with the present invention, which is shown in FIG. 3D, the black matrix formation may be completed without eliminating the negative light-sensitive film.

Figure 5:
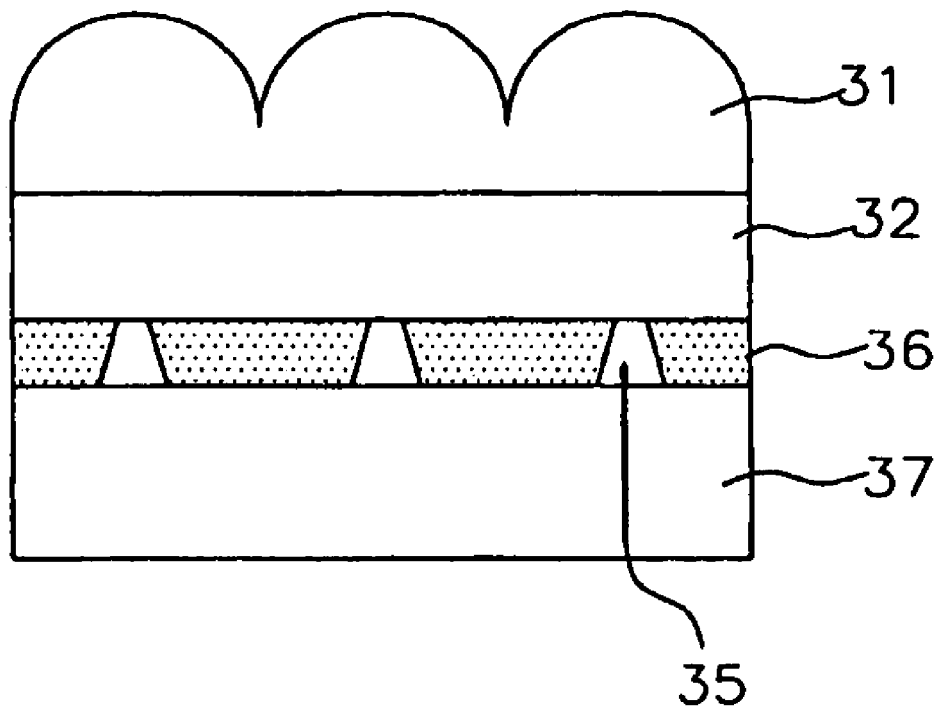
FIG. 5 is a sectional view illustrating a projection display screen having a light diffusion layer according to an embodiment of the present invention

FIG. 5 is a sectional view illustrating a projection screen having a light diffusion layer, in accordance with an embodiment of the present invention.

In this embodiment, the projection screen includes a microlens array layer 31, a transparent support substrate or film layer 32, a black matrix layer 36, light apertures 35, and a light diffusion layer 37.

The embodiment schematically illustrates a projection screen in which the light diffusion layer 37 is included in the microlens array sheet.

Referring to FIG. 5, speckles can be prevented and a viewing angle can be adjusted by adding the light diffusion layer 37 to the bottom surface of the microlens array sheet having the black matrix layer 36 formed by the process of FIGS. 3A to 3D. In order to obtain desired brightness and viewing angle characteristics, the light apertures 35 may be replaced with material having a specific reflective index. In particular, a lenticular or holographic surface-type is light diffusion layer 37 has a feature in which viewing angle characteristics are considerably degraded when an adhesion layer comes into contact with the lenticular or holographic surface that has surface projections and depressions in charge of diffusion. Accordingly, when the light apertures 35 are emptied and the light diffusion layer 37 is attached onto the bottom surface of the black matrix layer 36, surfaces in contact with the lenticular or holographic surface of the light diffusion layer 37 do not exist in the regions of the light apertures 35, so that desired viewing angle characteristics provided by the lenticular or holographic surface-type diffusion layer can be achieved.

As described above, the present invention provides the microlens array sheet applicable to projection screens and the manufacturing method thereof, which can prevent the loss of light that occurs when light emitted from the microlens array sheet is blocked by the black matrix layer, thus providing high brightness and a wider viewing angle to users.

In particular, the present invention method of filling necessary regions with a black pigment having a considerably low transmittance and a considerably low reflective index after photolithography is simpler than the existing complicated process, and is appropriate for the mass production of projection screens to which the optical sheet is applied.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a microlens array sheet having a black matrix layer, comprising the steps of:
   sequentially depositing a microlens array layer, a transparent support substrate or film layer, and a negative type light sensitive resin layer;
   radiating the microlens array layer with a parallel light, wherein the microlens array layer focuses the parallel light;
   forming trapezoidal shaped light aperture regions in the negative-type light sensitive resin layer by exposing the negative-type light sensitive resin layer to the focused light;
   eliminating non-exposed portions of the negative-type light sensitive resin layer not exposed to the focused light; and
   forming a black matrix layer in regions where the non-exposed portions have been eliminated, wherein the trapezoidal shaped light aperture regions are formed such that an area through which the focused light enters the negative-type light sensitive resin layer is smaller than an area of the region through which the focused light is emitted from the negative-type light sensitive resin layer.

2. The method as set forth in claim 1, further comprising the step of forming a light diffusion layer on a bottom surface of the black matrix layer.

3. The method as set forth in claim 2, wherein the light diffusion layer is a lenticular or holographic surface-type light diffusion layer.

4. The method as set forth in claim 1, wherein the light-sensitive resin layer has a light transmittance of more than 90%.

5. The method as set forth in claim 1, further comprising the step of eliminating portions of the trapezoidal shaped light aperture regions.

6. The method as set forth in claim 5, further comprising the step of forming a light diffusion layer on a bottom surface of the black matrix layer.

7. The method as set forth in claim 6, wherein the light diffusion layer is a lenticular or holographic surface-type light diffusion layer.

8. The method as set forth in claim 6, wherein the light-sensitive resin layer has a light transmittance of more than 90%.

* * * * *